US012593483B2

(12) United States Patent
Honda et al.

(10) Patent No.: US 12,593,483 B2
(45) Date of Patent: Mar. 31, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Shigeto Honda, Tokyo (JP); Yusuke Fukada, Tokyo (JP); Hayato Okamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 579 days.

(21) Appl. No.: 18/051,775

(22) Filed: Nov. 1, 2022

(65) Prior Publication Data

US 2023/0261056 A1     Aug. 17, 2023

(30) Foreign Application Priority Data

Feb. 15, 2022     (JP) ................................. 2022-021382

(51) Int. Cl.
H10D 62/17 (2025.01)
H10D 8/00 (2025.01)
(Continued)

(52) U.S. Cl.
CPC ............. H10D 62/393 (2025.01); H10D 8/00 (2025.01); H10D 8/01 (2025.01); H10D 12/038 (2025.01);
(Continued)

(58) Field of Classification Search
CPC ......... H10D 12/411–491; H10D 12/01; H10D 12/031–038; H10D 12/481;
(Continued)

(56) References Cited

U.S. PATENT DOCUMENTS 7,154,145 B2     12/2006   Takahashi
10,529,800 B2     1/2020   Mitsuzuka et al.
(Continued)

FOREIGN PATENT DOCUMENTS

JP     2009-170670 A     7/2009
JP         4799829 B2     10/2011
(Continued)

OTHER PUBLICATIONS

Office Action issued in DE 10 2022 129 831.0; mailed by the German Patent and Trademark Office on Nov. 21, 2025.

*Primary Examiner* — Natalia A Gondarenko
(74) *Attorney, Agent, or Firm* — Studebaker Brackett PLLC

(57)     ABSTRACT

To suppress an increase in RC-IGBT recovery loss. In a semiconductor device, an IGBT region includes a base layer of a second conductivity type in a surface layer of a drift layer, a diode region includes an anode layer of a second conductivity type in the surface layer of the drift layer, a termination region includes a well layer of the second conductivity type in the surface layer of the drift layer, an impurity concentration profile of the base layer and an impurity concentration profile of the anode layer in a direction along an upper surface of the drift layer cyclically fluctuate, and the impurity concentration profile of the base layer and the impurity concentration profile of the anode layer are different.

10 Claims, 9 Drawing Sheets

(51) Int. Cl.

| | | |
|---|---|---|
| *H10D 8/01* | (2025.01) | |
| *H10D 12/00* | (2025.01) | |
| *H10D 12/01* | (2025.01) | |
| *H10D 62/10* | (2025.01) | |
| *H10D 84/80* | (2025.01) | |

(52) U.S. Cl.
CPC ......... *H10D 12/481* (2025.01); *H10D 62/106* (2025.01); *H10D 84/811* (2025.01)

(58) Field of Classification Search
CPC ....... H10D 62/141–148; H10D 62/127; H10D 62/393; H10D 62/152–155; H10D 62/156–159; H10D 84/40–409; H10D 84/811; H10D 30/0281–0289; H10D 30/0267; H10D 30/0287; H10D 30/0295; H10D 30/601–608; H10D 30/668; H10D 30/658; H10D 30/65–659; H10D 30/603; H10D 8/00; H10D 8/01; H10D 8/045; H10D 8/422; H10D 62/106; H10D 62/112; H10D 62/125; H10D 62/128; H10D 62/142; H10D 62/60; H10D 64/117; H01L 21/2253; H01L 21/266

USPC ................ 257/139, 140, 335, 337, 324, 343
See application file for complete search history.

(56) References Cited

U.S. PATENT DOCUMENTS

| | | | | |
|---|---|---|---|---|
| 2010/0035421 | A1* | 2/2010 | Denison .............. | H01L 21/2652 257/E21.334 |
| 2012/0043581 | A1* | 2/2012 | Koyama ................ | H10D 8/422 257/140 |
| 2016/0043073 | A1 | 2/2016 | Tamura et al. | |
| 2018/0175149 | A1* | 6/2018 | Takaya ................ | H10D 12/031 |
| 2018/0308839 | A1 | 10/2018 | Takahashi | |
| 2020/0098747 | A1* | 3/2020 | Tamura ................ | H10D 84/811 |
| 2021/0091072 | A1* | 3/2021 | Matsudai ............ | H03K 17/567 |
| 2021/0091216 | A1 | 3/2021 | Soneda et al. | |
| 2021/0265491 | A1 | 8/2021 | Soneda et al. | |
| 2022/0302252 | A1* | 9/2022 | Matsudai ............ | H10D 12/481 |

FOREIGN PATENT DOCUMENTS

| | | |
|---|---|---|
| JP | 2021-052078 A | 4/2021 |
| JP | 2021-136311 A | 9/2021 |

* cited by examiner

F I G. 1

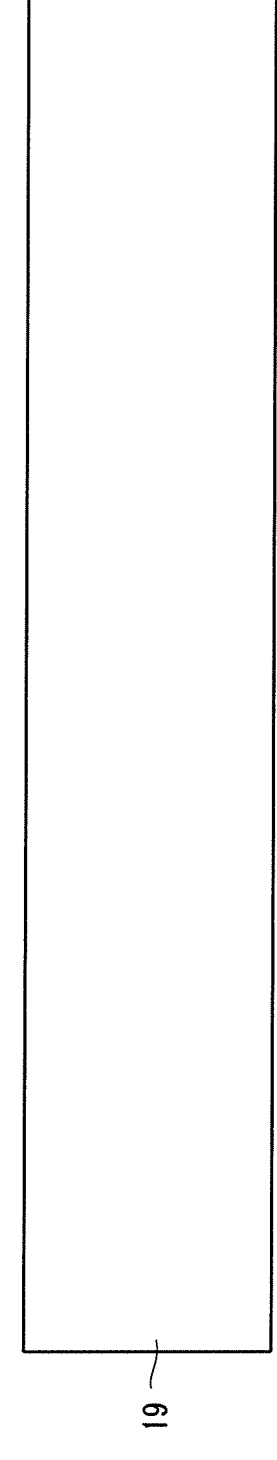
F I G. 2

F I G. 3
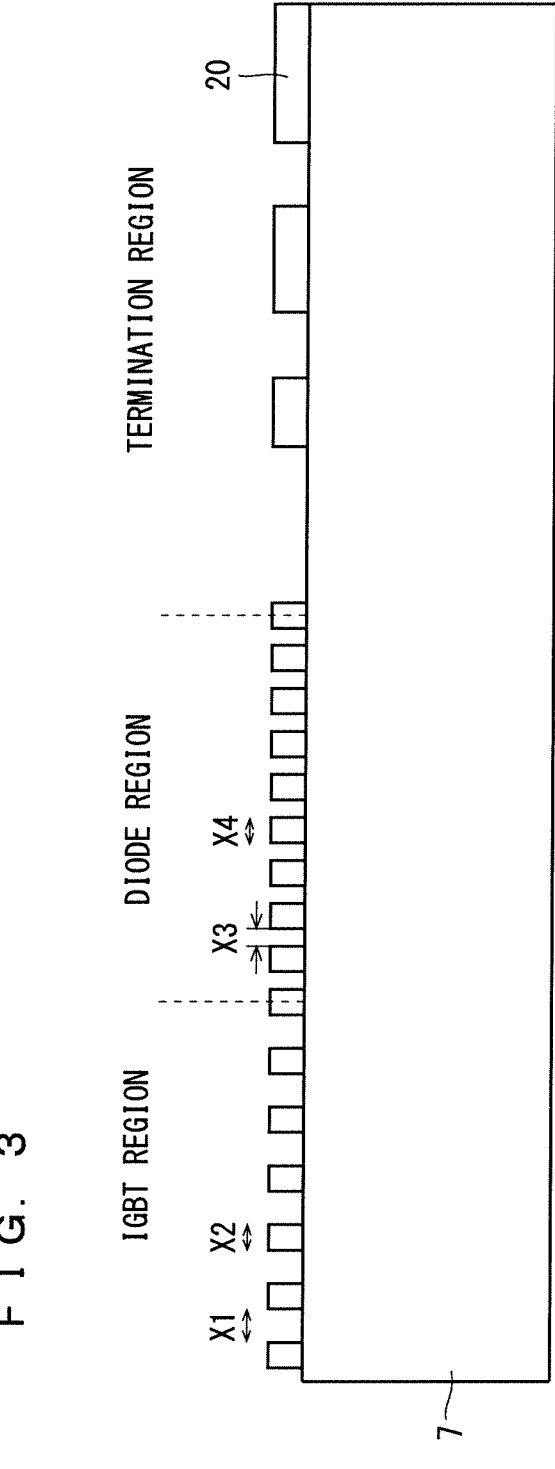

F I G 4

F I G.  5
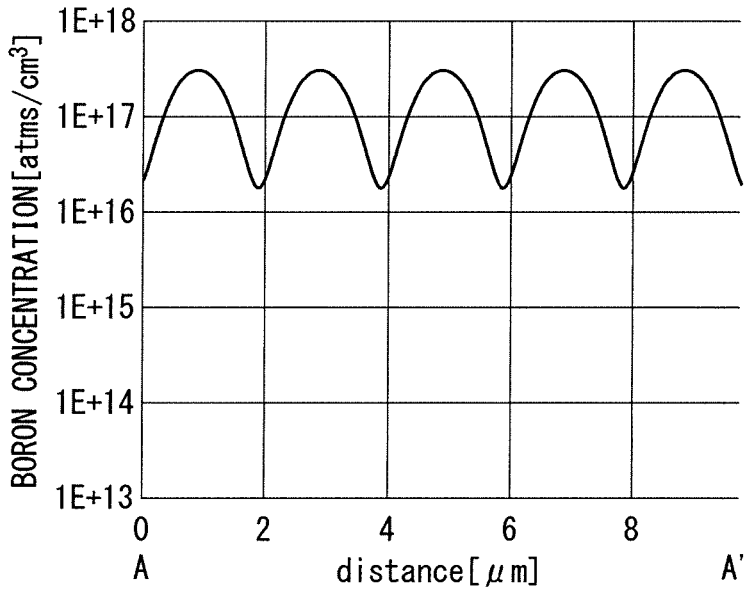

F I G.  6
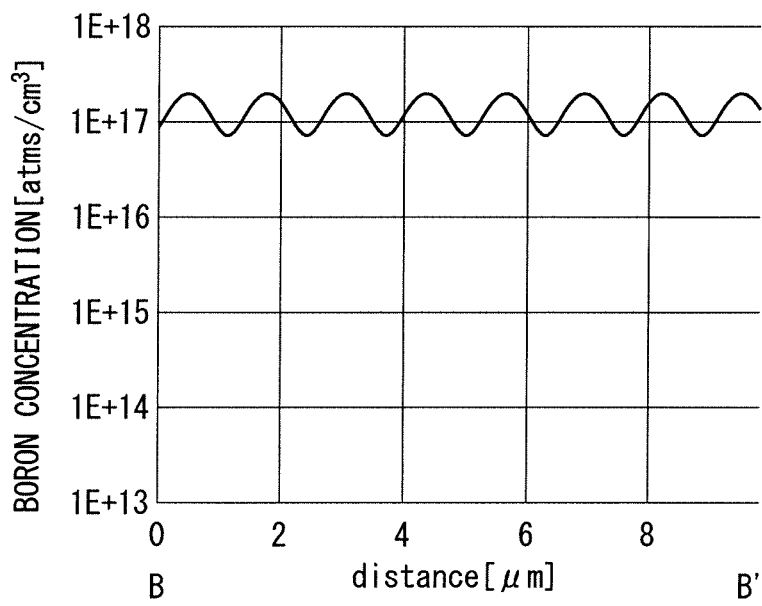

SEMICONDUCTOR DEVICE AND METHOD OF MANUFACTURING SEMICONDUCTOR DEVICE

BACKGROUND OF THE INVENTION

Field of the Invention

The technology disclosed in the present specification relates to a semiconductor device.

Description of the Background Art

For example, Japanese Patent Application Laid-Open No. 2021-136311 discloses a reverse conducting insulated gate bipolar transistor (IGBT), that is, an RC-IGBT. Here, an RC-IGBT is the one in which an IGBT and a free-wheeling diode (that is, FWD) are formed on one semiconductor substrate.

On the front surface side of the RC-IGBT disclosed in Japanese Patent Application Laid-Open No. 2021-136311, a P-type base layer is formed in the IGBT region, a P-type anode layer is formed in the diode region, and a P-type well layer is formed in the termination region, and the P-type base layer in the IGBT region and the P-type anode layer in the diode region are formed flat with a uniform depth.

In the RC-IGBT, which has a structure in which an IGBT and a diode are integrated, holes, which are carriers, flow from the IGBT region to the diode region. Therefore, the power loss during recovery operation of the diode, that is, the recovery loss, increases.

In addition, in the RC-IGBT disclosed in Japanese Patent Application Laid-Open No. 2021-136311, the impurity concentration of the P-type anode layer in the diode region and the impurity concentration of the P-type base layer in the IGBT region are the same; therefore, the P-type anode layer will have an impurity concentration optimized for IGBT characteristics. As a result, more holes flow from the P-type anode layer, which also increases the recovery loss of the diode.

SUMMARY

The technology disclosed in the present specification is a technology for suppressing an increase in the RC-IGBT recovery loss.

In a semiconductor device being a first aspect of the technology disclosed in the present specification, which is an RC-IGBT in which an IGBT region and a diode region, which are an active region, and a termination region surrounding the active region in plan view are provided on a single semiconductor substrate, a drift layer of a first conductivity type is provided on an upper surface of the semiconductor substrate, the IGBT region includes a base layer of a second conductivity type in a layer surface of the drift layer, the diode region includes an anode layer of the second conductivity type in the layer surface of the drift layer, the termination region includes a well layer of the second conductivity type in the layer surface of the drift layer, an impurity concentration profile of the base layer and an impurity concentration profile of the anode layer in a direction along an upper surface of the drift layer cyclically fluctuate, and the impurity concentration profile of the base layer and the impurity concentration profile of the anode layer are different.

According to at least the first aspect of the technology disclosed in the present specification, the impurity concentration profiles of the base layer and the anode layer cyclically fluctuate, thereby reducing the inflow of holes and suppressing an increase in recovery loss.

The objects, characteristics, aspects, and advantages of the technique disclosed in the present specification will become more apparent from the following detailed description and the accompanying drawings.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a cross-sectional view schematically illustrating a configuration example of an RC-IGBT, which is a semiconductor device, according to a first embodiment;

FIG. 2 is a cross-sectional view illustrating an example of a step of forming a P-type semiconductor layer of the configuration the RC-IGBT according to a first embodiment;

FIG. 3 is a cross-sectional view illustrating an example of a step of forming the P-type semiconductor layer of the configuration the RC-IGBT according to a first embodiment;

FIG. 4 is a cross-sectional view illustrating an example of a step of forming the P-type semiconductor layer of the configuration the RC-IGBT according to a first embodiment;

FIG. 5 is a graph illustrating an example of boron concentration distribution at a line A-A' in the P-type base layer in the IGBT region illustrated in FIG. 4;

FIG. 6 is a graph illustrating an example of boron concentration distribution at a line B-B' in the P-type base layer in the diode region illustrated in FIG. 4;

FIG. 7 is a cross-sectional view schematically illustrating a configuration example of an RC-IGBT, which is a semiconductor device, according to a second embodiment;

FIG. 8 is a cross-sectional view schematically illustrating a configuration example of an RC-IGBT, which is a semiconductor device, according to a third embodiment; and FIG. 9 is a cross-sectional view schematically illustrating a configuration example of an RC-IGBT, which is a semiconductor device, according to a fourth embodiment.

DESCRIPTION OF THE PREFERRED EMBODIMENTS

Hereinafter, the embodiments will be described with reference to the attached drawings. In the following embodiments, although detailed features and the like are also illustrated for technical explanation, they are mere examples, and not all the features to be described are essential for the feasibility of the embodiments.

It should be noted that the drawings are schematically illustrated, and for the convenience of explanation, some omissions or simplifications of the configuration may be made in the drawings as appropriate. Also, the mutual relationship among sizes and positions in configurations and the like illustrated in different drawings are not necessarily accurately described, and may be changed as appropriate. In addition, in the drawings such as plan views that are not cross-sectional views, hatching may be given to facilitate understanding of the contents of the embodiments.

In addition, in the following description, the same components are denoted by the same reference numerals, and the names and functions thereof are also similar. Accordingly, detailed descriptions thereof may be omitted to avoid redundancy.

Also, in the description written in the present specification, when it is described that a certain component is "equipped", "included", or "an object has a certain component", etc., such wording does not exclude the existence of another component unless otherwise specified.

Also, in the description written in the present specification, even though ordinal numbers such as "first", and "second" may be used, these terms are for promoting the understanding of the contents and are not for defining the order caused by such ordinal numbers.

Also, in the description to be made in the present specification, terms that express the relative or absolute positional relationship (for example, "in one direction" "along one direction", "parallel", "orthogonal", "center", "concentric", "coaxial", etc.) express a state where the precise positional relationship is described, and express a state of being displaced relative to an angle or distance to the extent that tolerance or similar functionality is obtained, unless otherwise specified.

Also, in the description written in the present specification, descriptions representing equivalency such as "Same", "equal", "uniform", "homogeneous" include the case of being an exact equal state and the case where there is a difference within the tolerance or the range where the same function can be obtained, unless otherwise specified.

Also, in the description to be made in the present specification, even though terms indicating specific positions or directions such as "upper", "lower", "left", "right", "side", "bottom", "front", and "back" may be used, these terms are for promoting the understanding of the contents of embodiments and are not related to the positions or directions at the time of implementation of the embodiments.

In addition, in the description written in the present specification, in a case where "the upper surface of . . . ", "the lower surface of . . . " or the like is described, in addition to the upper surface or lower surface of the component of interest itself, a state in which other components are formed on the upper surface or lower surface is also included. That is, for example, when it is described as "B provided on the upper surface of A", it does not exclude a case where another component "C" is present between A and B.

First Embodiment

Hereinafter, a semiconductor device and a method of manufacturing the semiconductor device according to the first embodiment will be described below. In the following description, in terms of the conductivity type of the semiconductor, N-type represents the first conductivity type and P-type represents the second conductivity type. However, in contrast, such corresponding relationships may be reversed where P-type represents the first conductivity type and N-type represents the second conductivity type.

<Configuration of Semiconductor Device>

Figure 1:
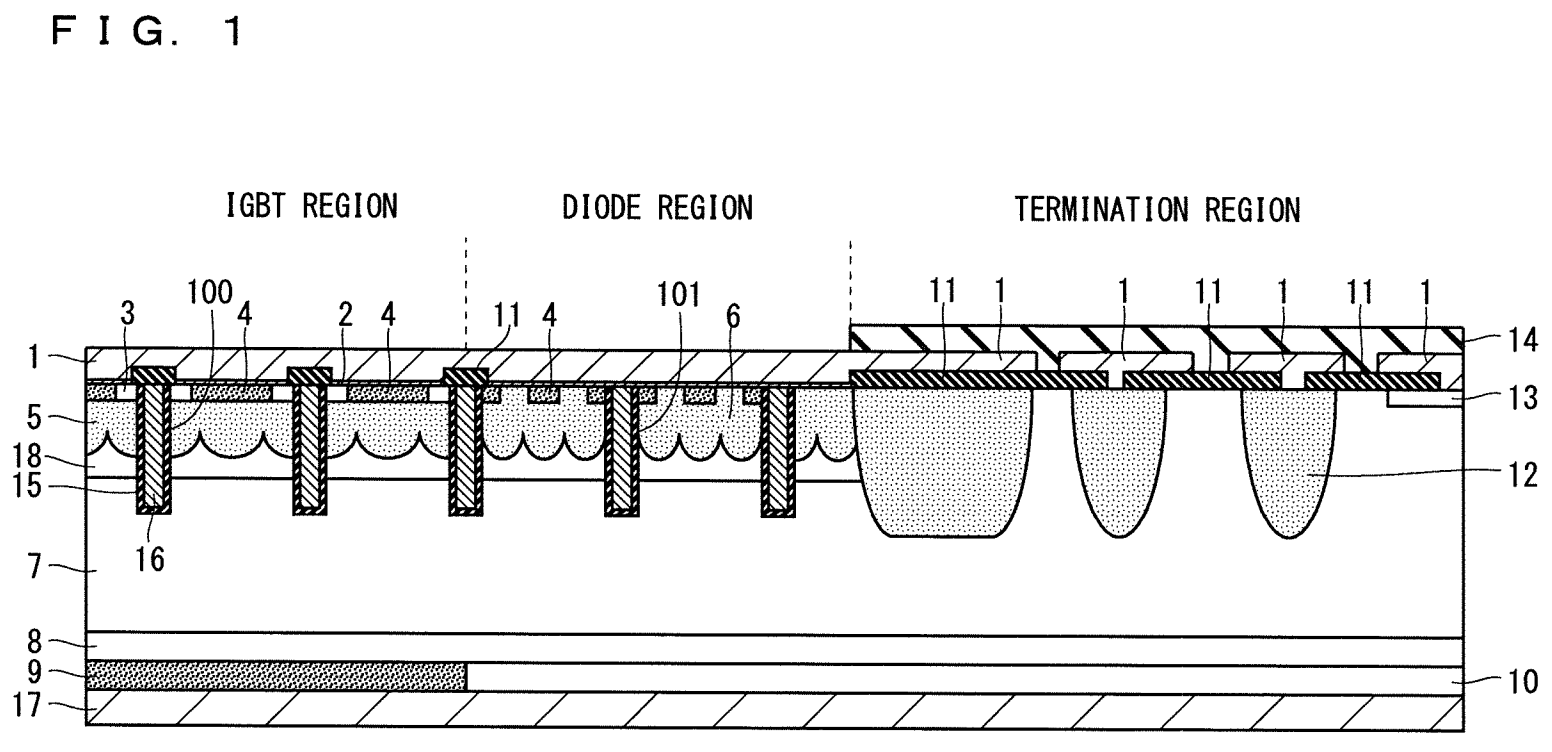

FIG. 1 is a cross-sectional view schematically illustrating a configuration example of an RC-IGBT, which is a semiconductor device, according to the first embodiment. An IGBT region, a diode region and a termination region in FIG. 1 are formed in a single semiconductor substrate with an N-type drift layer 7. The IGBT region and the diode region form an active region.

In the IGBT region, an N-type carrier stored (CS) layer 18 having a higher impurity concentration than the N$^-$-type drift layer 7 is formed in a surface layer of the N$^-$-type drift layer 7. A P-type base layer 5 is formed above the N-type CS layer 18 in the surface layer of the N-type drift layer 7.

Further, on the surface layer of the P-type base layer 5, an N$^+$-type source layer 3 having a higher impurity concentration than the N$^-$-type drift layer 7 and a P$^+$-type contact layer 4 having a higher impurity concentration than the P-type base layer 5 are formed.

Also, from the upper surface of the N$^-$-type drift layer 7 in the IGBT region (that is, the upper surface of the N$^+$-type source layer 3), trenches 100 extending through the N$^+$-type source layer 3, the P-type base layer 5 and the N-type CS layer 18, and reaching the N$^-$-type drift layer 7 are formed. The gate oxide film 15 is formed on the side walls of the trenches 100. The gate oxide film 15 is formed in contact with the P-type base layer 5 interposed between the N$^+$-type source layer 3 and drift layer 7. A gate electrode 16 is formed in the trench 100 and is opposite to the N$^+$-type source layer 3, the P-type base layer 5, the N-type CS layer 18 and the N$^-$-type drift layer 7 via the gate oxide film 15. An insulating film 11 is formed on the upper surface of the gate electrode 16.

A barrier metal 2 is formed on the upper surface of the N$^+$-type source layer 3 and the upper surface of the P$^+$-type contact layer 4 that are not covered with the insulating film 11 in the IGBT region. Also, a front surface electrode 1 is formed covering the upper surface of the insulating film 11 and the upper surface of the barrier metal 2.

An N-type buffer layer 8 having a higher impurity concentration than the N$^-$-type drift layer 7 is formed on the lower surface side of the N$^-$-type drift layer 7 in the IGBT region. A P$^+$-type collector layer 9 is formed below the N-type buffer layer 8. A rear surface electrode 17 is formed below the P$^+$-type collector layer 9.

In the diode region, the N-type CS layer 18 having a higher impurity concentration than the N-type drift layer 7 is formed in the surface layer of the N$^-$-type drift layer 7. A P-type anode layer 6 is formed above the N-type CS layer 18 in the surface layer of the N$^-$-type drift layer 7. The P$^+$-type contact layer 4 having a higher impurity concentration than the P-type anode layer 6 is formed above the P-type anode layer 6 in the surface layer of the N-type drift layer 7.

Also, from the upper surface of the N$^-$-type drift layer 7 in the diode region (that is, the upper surface of the P$^+$-type contact layer 4), trenches 101 extending through the P$^+$-type contact layer 4, the P-type anode layer 6 and the N-type CS layer 18 and reaching the N$^-$-type drift layer 7. The gate oxide film 15 is formed on the side walls of the trenches 101. The gate electrode 16 is formed in the trench 101 and is opposite to the P$^+$-type contact layer 4, the P-type anode layer 6, the N-type CS layer 18 and the N$^-$-type drift layer 7 via the gate oxide film 15.

The barrier metal 2 is formed on the upper surface of the P$^+$-type contact layer 4 and the upper surface of the P-type anode layer 6 that are not covered with the insulating film 11 in the diode region. Also, the front surface electrode 1 is formed covering the upper surface of the insulating film 11 and the upper surface of the barrier metal 2.

The N-type buffer layer 8 having a higher impurity concentration than the N$^+$-type drift layer 7 is formed on the lower surface side of the N-type drift layer 7 in the diode region. An N$^+$-type cathode layer 10 having a higher impurity concentration than the N-type buffer layer 8 is formed below the N-type buffer layer 8. Also the rear surface electrode 17 is formed below the N$^+$-type cathode layer 10.

In the termination region, a P-type well layer 12 is formed in the surface layer of the N$^-$-type drift layer 7. Further, an N-type channel stopper layer 13 having a higher impurity concentration than the N$^-$-type drift layer 7 is formed on the outermost periphery away from the IGBT region.

The insulating film 11 is formed on the upper surface of the N⁻-type drift layer 7, parts of the upper surface of the P-type well layer 12, and parts of the upper surface of the N-type channel stopper layer 13 in the termination region. Then, the front surface electrode 1 is formed covering the upper surface of the P-type well layer 12 exposed from the insulating film 11, the upper surface of the N-type channel stopper layer 13 exposed from the insulating film 11, and the upper surface of the N⁻-type drift layer 7. The front surface electrode 1 contacts the parts of the upper surface of the P-type well layer 12 and the parts of the upper surface of the N-type channel stopper layer 13. Also, a mixed insulating film 14 in which a semi-insulating film and an insulating film are mixed is formed which covers the front surface electrode 1 and the insulating film 11 exposed from the front surface electrode 1.

The N-type buffer layer 8 having a higher impurity concentration than the N⁻-type drift layer 7 is formed on the lower surface side of the N⁻-type drift layer 7 in the termination region. An N⁺-type cathode layer 10 having a higher impurity concentration than the N-type buffer layer 8 is formed below the N-type buffer layer 8. Also the rear surface electrode 17 is formed below the N⁺-type cathode layer 10.

Of the description above, the P-type base layer 5 in the IGBT region is not formed flat with a uniform depth. Specifically, the P-type base layer 5 in the IGBT region is formed in a manner that depth and concentration vary at regular intervals in the direction along the upper surface (first main surface) of the N⁻-type drift layer 7.

Also, the P-type base layer 5 in the diode region is not formed flat with a uniform depth as well. Specifically, although the P-type base layer 5 in the diode region is formed in a manner that depth and concentration vary at regular intervals in the direction along the first main surface, this is a different manner from that of the P-type base layer 5 in the IGBT region.

<Method of Manufacturing Semiconductor Device>

Figure 4:
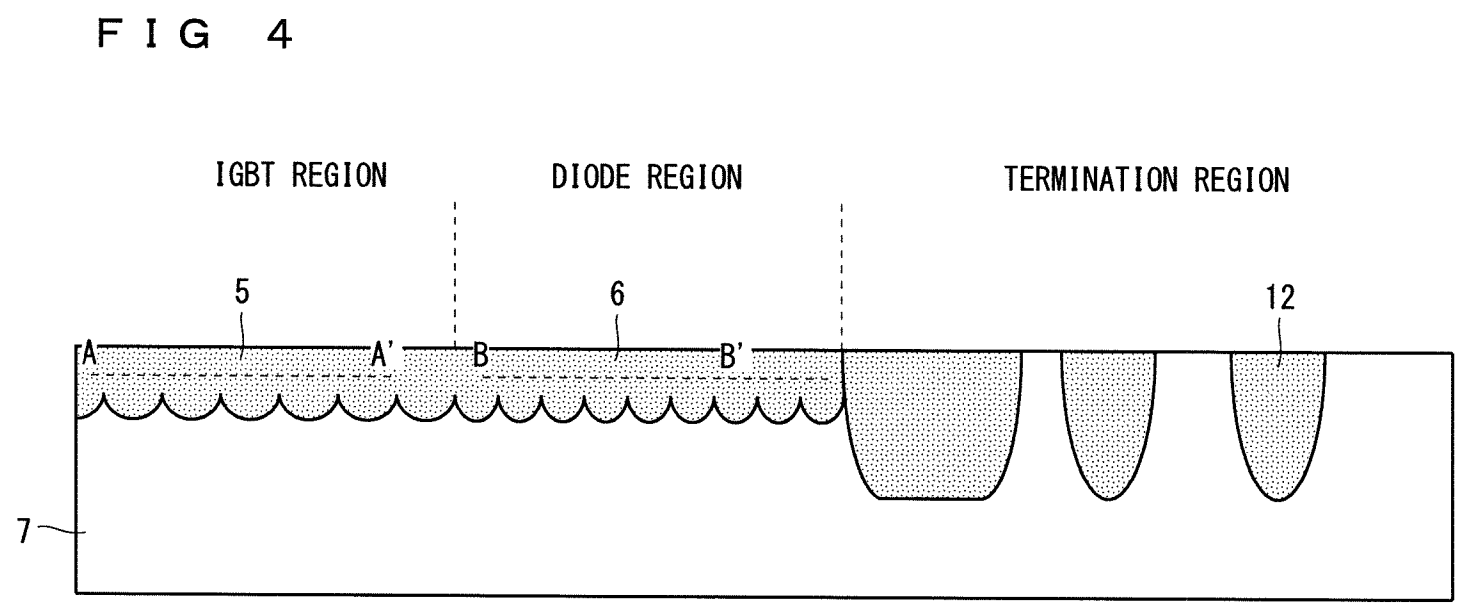

FIGS. 2, 3, and 4 are cross-sectional views illustrating an example of steps forming P-type semiconductor layers (specifically, P-type base layer 5, P-type anode layer 6 and P-type well layer 12) in the configuration of the RC-IGBT related to the first embodiment.

First, as an example is illustrated in FIG. 2, an N-type semiconductor substrate 19 (for example, a specific resistance ρ of 23 Ω·cm and a thickness of 725 μm) is prepared. Next, the N⁻-type drift layer 7 is formed on the upper surface of the N-type semiconductor substrate 19.

Then, as an example illustrated in FIG. 3, the photomechanical process is performed over the IGBT region, the diode region, and the termination region of for the N⁻-type drift layer 7 of the N-type semiconductor substrate 19 using a photomask 20 (photoresist).

Here, while in the conventional manufacturing method, no openings of the photomask 20 were not arranged in the portion to be the IGBT region and the portion to be the diode region, openings of the photomask 20 are partially arranged for the portion to be the IGBT region and the portion to be the diode region in addition to the portion to be the termination region.

For example, a photoresist pattern is formed in which strip removed portions and strip remaining portions are alternated in stripe geometry in plan view. The dimensional width of a removed portion in the IGBT region (width X1 illustrated in FIG. 3) is set to 0.6 μm, for example, and the dimensional width of a remaining portion in the IGBT region (width X2 illustrated in FIG. 3) is set to 1.4 μm, for example. Also, the dimensional width of a removed portion in the diode region (width X3 illustrated in FIG. 3) is set to 0.4 μm, for example, and the dimensional width of a remaining portion in the diode region (width X4 illustrated in FIG. 3) is set to 0.9 μm, for example. In the first embodiment, the width of the openings periodically formed in the IGBT region is different from the width of the openings periodically formed in the diode region.

After forming the photoresist pattern as described above, an ion implantation process (for example, boron implantation process, where the boron is implanted at a dose of $3 \times 10^{14}$ atoms/cm² for example) is performed, and the dopant is implanted into the N⁺-type drift layer 7.

And then, performing the heat treatment (1100° C. for 60 minutes, for example) allows to activate the implanted dopants in the IGBT region, the diode region, and the termination region and to diffuse them to the desired depth.

At this point, the implanted dopants diffuse not only in the implantation depth direction but also in the direction orthogonal to the implantation depth direction; therefore the P-type base layer 5 in the IGBT region and the P-type anode layer 6 in the diode region are connected and the P-type anode layer 6 in the diode region and the P-type well layer 12 in the termination region are connected as illustrated in FIG. 4.

FIG. 5 is a graph illustrating an example of boron concentration distribution at a line A-A' in the P-type base layer in the IGBT region illustrated in FIG. 4. In FIG. 5, the vertical axis indicates the boron concentration [atoms/cm³], and the horizontal axis indicates the distance [μm] toward the outer peripheral side of the IGBT region.

As an example is illustrated in FIG. 5, the change in the boron concentration in the base layer 5 illustrates certain cyclic repetition. The cycle of change in the boron concentration is determined by the dimensional width of the removed portion and the dimensional width of the remaining portion of the photomask 20, boron implantation conditions, heat treatment conditions, and the like.

FIG. 6 is a graph illustrating an example of boron concentration distribution at a line B-B' in the P-type base layer 6 in the diode region illustrated in FIG. 4. In FIG. 6, the vertical axis indicates the boron concentration [atoms/cm³], and the horizontal axis indicates the distance [μm] toward the outer peripheral side of the diode region.

As an example is illustrated in FIG. 6, the change in the boron concentration in the anode layer 6 illustrates certain cyclic repetition. However, the dimensional width of the removed portion and the dimensional width of the remaining portion of the photomask 20 are different from those in the IGBT region; therefore, the cycle of change in the boron concentration in the diode region is different from the cycle of change in the boron concentration in the IGBT region. Specifically, the cycle of change in the boron concentration in the diode region is shorter than the cycle of change in the boron concentration in the IGBT region.

The cycle of change in the boron concentration is controllable by adjusting the ratio of the dimensional width of the removing portion and the dimensional width of the remaining portion (that is, the opening ratio of the photomask 20). Therefore, adjusting as above realizes appropriate concentration distributions with the concentration distribution of the P-type base layer 5 in the IGBT region and the concentration distribution of the P-type anode layer 6 in the diode region being controlled, respectively.

As described above, in the RC-IGBT according to the first embodiment, the P-type base layer 5 in the IGBT region, the P-type anode layer 6 in the diode region, and the P-type well layer 12 in the termination region are formed in a single round photomechanical process (that is, a single sheet photomask 20). Therefore, the reduction in manufacturing cost of an RC-IGBT is ensured.

Second Embodiment

The semiconductor device according to a second embodiment will be described. In the following description, components similar to those described in the embodiment described above are denoted by the same reference numerals, and detailed description thereof will be omitted as appropriate.

Figure 7:
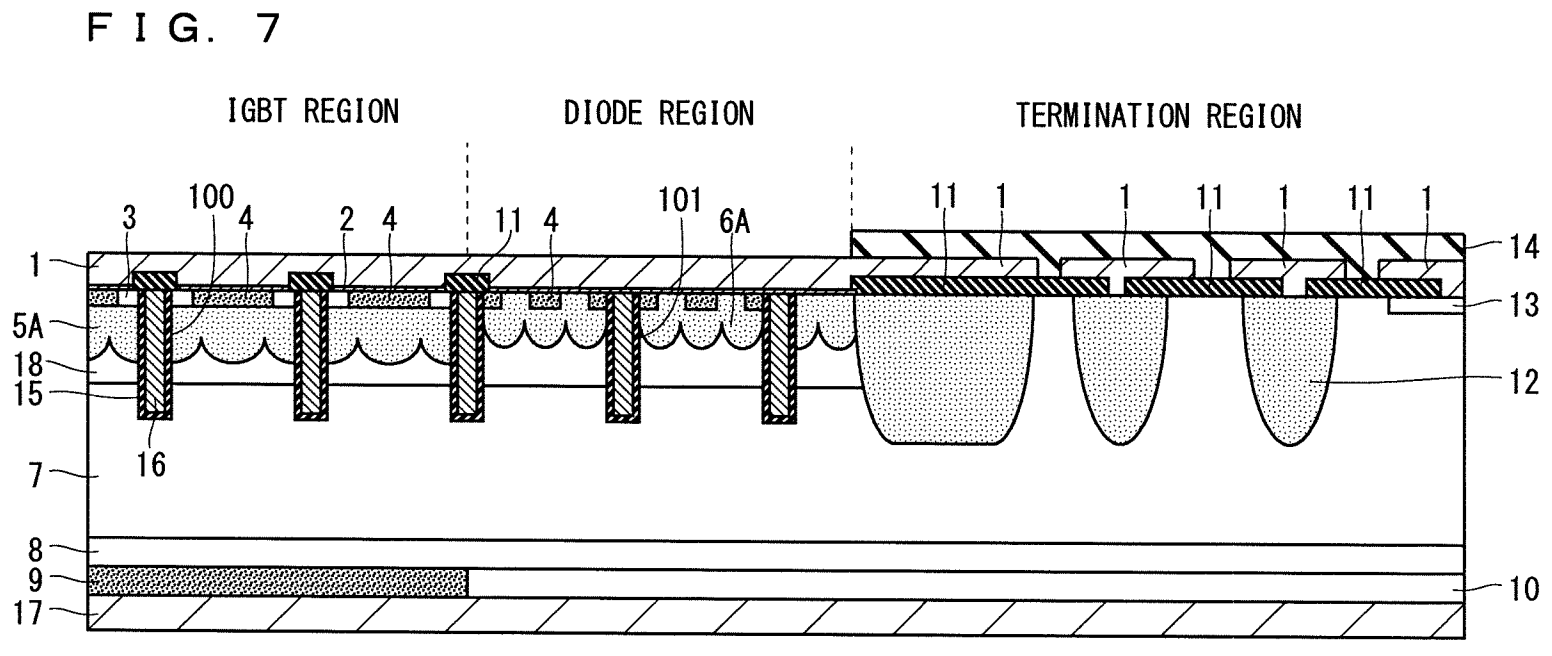

FIG. 7 is a cross-sectional view schematically illustrating a configuration example of an RC-IGBT, which is a semiconductor device, according to the second embodiment.

In the IGBT region of the RC-IGBT illustrated in FIG. 7, an N$^-$-type drift layer 7, an N-type CS layer 18, an N$^+$-type source layer 3, and a P$^+$-type contact layer 4 are formed. Also, a P-type base layer 5A is formed above the N-type CS layer 18 in the surface layer of the N$^-$-type drift layer 7. In addition, in the IGBT region, trenches 100, a gate oxide film 15, an insulating film 11, a barrier metal 2, a front surface electrode 1, an N-type buffer layer 8, a P$^+$-type collector layer 9, and a back surface electrode 17 are formed.

In the diode region of the RC-IGBT illustrated in FIG. 7, the N$^-$-type drift layer 7 and the N-type CS layer 18 are formed. A P-type anode layer 6A is formed above the N-type CS layer 18 in the surface layer of the N$^-$-type drift layer 7. In the diode region the P$^+$-type contact layer 4, trenches 101, the gate oxide film 15, the barrier metal 2, the front surface electrode 1, the N-type buffer layer 8, the N$^+$-type cathode layer 10, and the back surface electrode 17 are formed.

In the RC-IGBT illustrated in FIG. 7, the impurity concentration (dopant concentration) per unit area of the P-type base layer 5A in the IGBT region is higher than the impurity concentration (dopant concentration) per unit area of the P-type anode layer 6A in the diode region. In addition, in the RC-IGBT illustrated in FIG. 7, the formation depth of the P-type base layer 5A in the IGBT region is deeper than the formation depth of the P-type anode layer 6A in the diode region.

For example, when the dimensional width is set to 0.6 μm for the removed portions and the dimensional width is set to 1.4 μm for the remaining portions for the photomask 20 for forming the P-type base layer 5A in the IGBT region and the dimensional width is set to 0.4 μm for removed portions, and the dimensional width is set to 1.6 μm for the remaining portions for the photomask 20 for forming the P-type anode layer 6A in the diode region, the impurity concentration (dopant concentration) per unit area of the P-type base layer 5A in the IGBT region is 1.5 times the impurity concentration (dopant concentration) per unit area of the P-type anode layer 6A in the diode region.

The impurity concentration (dopant concentration) of the P-type base layer 5A in the IGBT region is designed according to a design value of the threshold voltage of the IGBT. Meanwhile, in order to secure a Reverse Blocking Safe Operation Area (RBSOA) at turn-off and prevent a latch-up, the resistance value of the P-type base layer 5A needs to be lowered. Therefore, the impurity concentration (dopant concentration) of the P-type base layer 5A in the IGBT region is preferably set high.

Here, if the impurity concentration (dopant concentration) of the P-type anode layer 6A in the diode region is raised, the hole-injection efficiency of the holes from the P-type anode layer 6A when the diode is turned on is increased and the carrier concentration accumulated in the N$^-$-type drift layer 7 increases. This increases recovery loss.

Therefore, in an RC-IGBT which is required a reduction in recovery loss for high-frequency operation applications, the concentration of the P-type anode layer 6A in the diode region is preferably set low.

In the RC-IGBT according to the second embodiment, the impurity concentration (dopant concentration) of the P-type base layer 5A in the IGBT region is higher than the impurity concentration (dopant concentration) of the P-type anode layer 6A in the diode region. Therefore, the reduction in the recovery loss of the diode is ensured while maintaining the threshold voltage and the RBSOA at turn-off required for the IGBT characteristics.

Third Embodiment

The semiconductor device according to a third embodiment will be described. In the following description, components similar to those described in the embodiments described above are denoted by the same reference numerals, and detailed description thereof will be omitted as appropriate.

Figure 8:
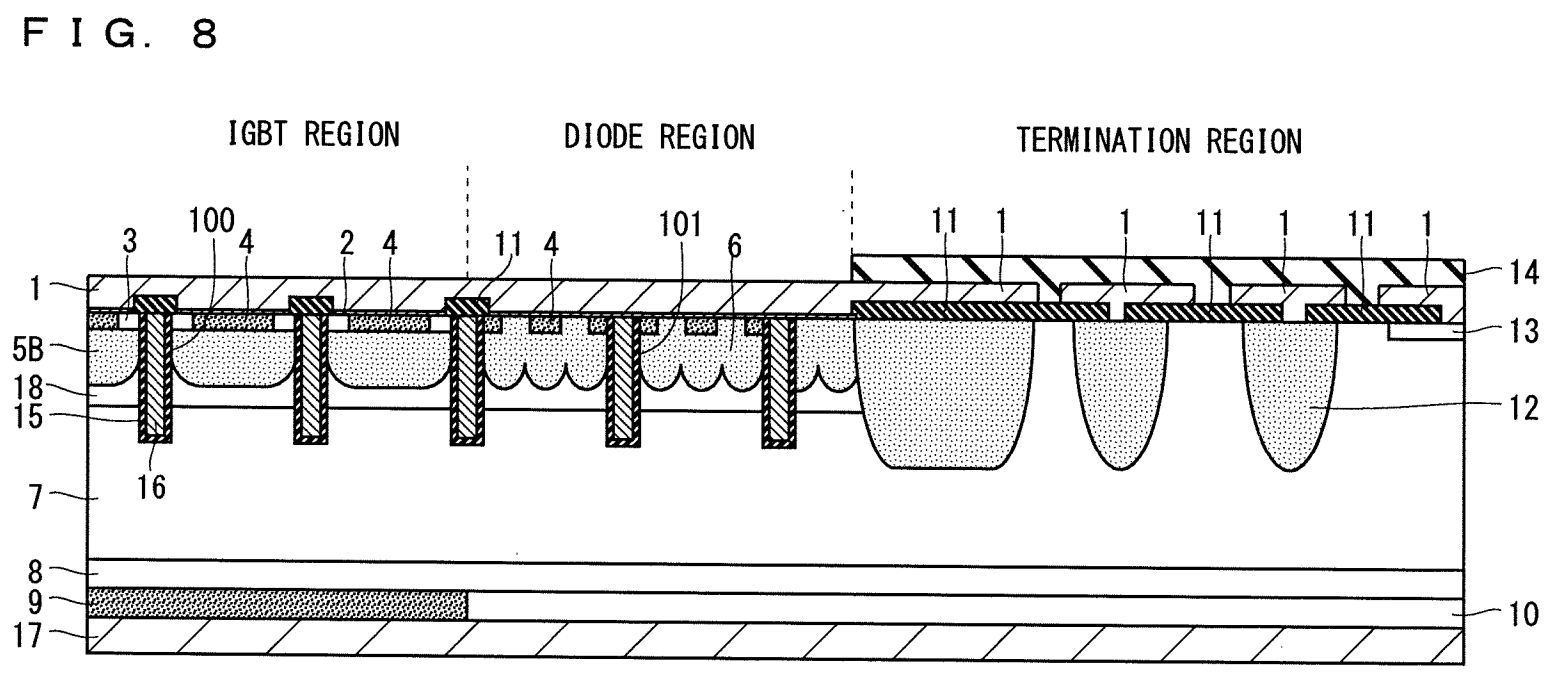

FIG. 8 is a cross-sectional view schematically illustrating a configuration example of an RC-IGBT, which is a semiconductor device, according to the third embodiment.

In the IGBT region of the RC-IGBT illustrated in FIG. 8, an N$^-$-type drift layer 7, an N-type CS layer 18, an N$^+$-type source layer 3, and a P$^+$-type contact layer 4 are formed. Also, a P-type base layer 5B is formed above the N-type CS layer 18 in the surface layer of the N$^-$-type drift layer 7. In addition, in the IGBT region, trenches 100, a gate oxide film 15, an insulating film 11, a barrier metal 2, a front surface electrode 1, an N-type buffer layer 8, a P$^+$-type collector layer 9, and a back surface electrode 17 are formed.

In the RC-IGBT illustrated in FIG. 8, the impurity concentration per unit area at the positions near the trenches 100 of the P-type base layer 5B in the IGBT region is lower than the impurity concentration per unit area at the positions near the centers of the mesa portions between the trenches 100. Such a concentration distribution can be formed, for example, by making the remaining portions of the photomask 20 for forming the P-type base layer 5B in the IGBT region correspond to the positions where the gate electrode 16 are formed.

The threshold voltage of the IGBT is influenced by the impurity concentration (dopant concentration) of the positions in the P-type base layer 5B in contact with the gate oxide film 15, which are the side walls of the trenches 100. In order to increase the RBSOA during turn-off, it is desirable to lower the resistance value by increasing the impurity concentration of the P-type base layer 5B in the IGBT region; however, a uniform increase in the impurity concentration of the P-type base layer 5B also influences the threshold voltage.

In the RC-IGBT according to the third embodiment, in the P-type base layer 5B in the IGBT region, the impurity concentration (dopant concentration) in the central portions (near the centers of the mesa portions) of the P-type base layer 5B is higher than the impurity concentration of positions in the P-type base layer 5B near the trenches 100. Therefore, the RBSOA at turn-off is improved while maintaining the threshold voltage required for the IGBT characteristics.

Fourth Embodiment

The semiconductor device according to a fourth embodiment will be described. In the following description, components similar to those described in the embodiments described above are denoted by the same reference numerals, and detailed description thereof will be omitted as appropriate.

Figure 9:
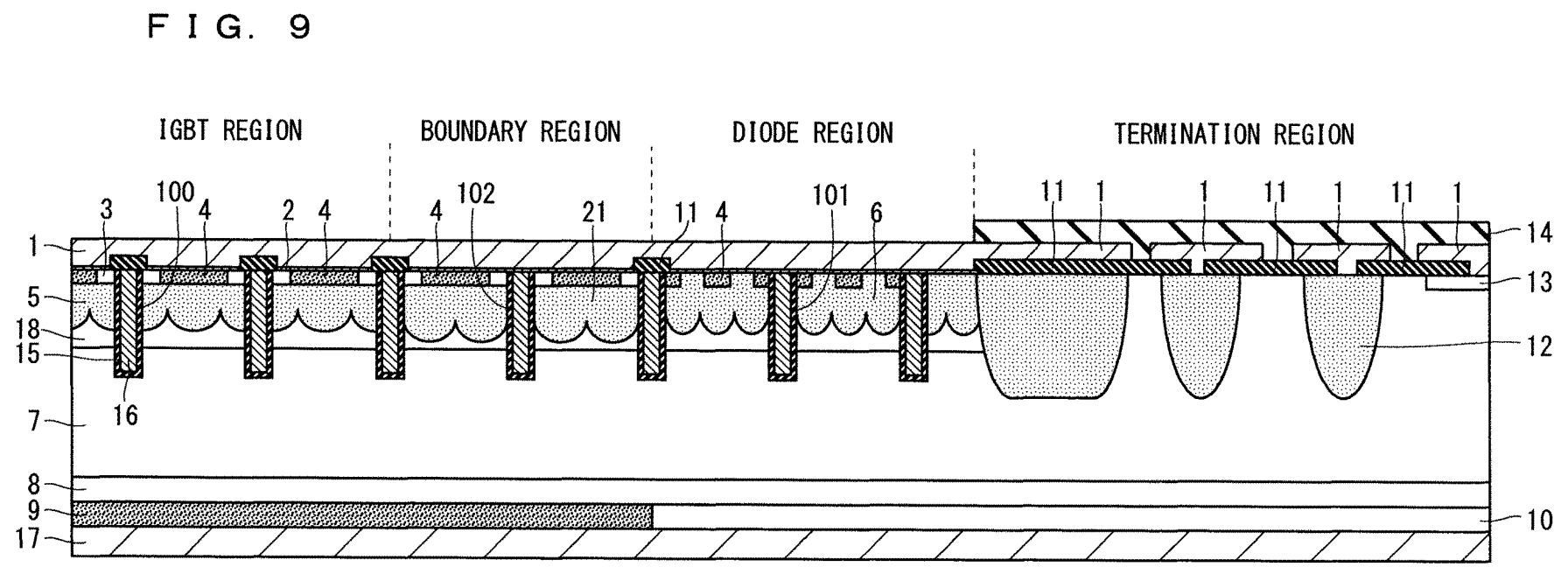

FIG. 9 is a cross-sectional view schematically illustrating a configuration example of an RC-IGBT, which is a semiconductor device, according to the fourth embodiment. An IGBT region, a diode region, boundary region and a termination region in FIG. 9 are formed in a single semiconductor substrate with an N$^-$-type drift layer 7. The boundary region is located between the IGBT region and the diode region.

In the boundary region of the RC-IGBT illustrated in FIG. 9, the N-type CS layer 18 having a higher impurity concentration than the N$^-$-type drift layer 7 is formed in the surface layer of the N$^-$-type drift layer 7. Also, a P-type boundary base layer 21 is formed above the N-type CS layer 18 in the surface layer of the N$^-$-type drift layer 7. Further, on the surface layer of the P-type boundary base layer 21, an N$^+$-type source layer 3 having a higher impurity concentration than the N$^-$-type drift layer 7 and a P$^+$-type contact layer 4 having a higher impurity concentration than the P-type boundary base layer 21 are formed.

Also, from the upper surface of the N$^-$-type drift layer 7 in the boundary region (that is, the upper surface of the N$^+$-type source layer 3), a trench 102 extending through the N$^+$-type source layer 3, the P-type boundary base layer 21 and the N-type CS layer 18, and reaching the N$^-$-type drift layer 7 is formed. The gate oxide film 15 is formed on the side walls of the trench 102. A gate electrode 16 is formed in the trench 102 and is opposite to the N$^+$-type source layer 3, the P-type boundary base layer 21, the N-type CS layer 18 and the N-type drift layer 7 via the gate oxide film 15. An insulating film 11 is formed on the upper surface of the gate electrode 16.

A barrier metal 2 is formed on the upper surface of the N$^+$-type source layer 3 and the upper surface of the P$^+$-type contact layer 4 that are not covered with the insulating film 11 in the boundary region. Also, a front surface electrode 1 is formed covering the upper surface of the insulating film 11 and the upper surface of the barrier metal 2.

An N-type buffer layer 8 having a higher impurity concentration than the N$^-$-type drift layer 7 is formed below the N$^-$-type drift layer 7 in the boundary region. A P$^+$-type collector layer 9 is formed below the N-type buffer layer 8. A rear surface electrode 17 is formed below the P$^+$-type collector layer 9.

Here, the impurity concentration per unit area of the P-type boundary base layer 21 in the boundary region is higher than the impurity concentration per unit area of the P-type base layer 5 in the IGBT region. Also, the impurity concentration per unit area of the P-type boundary base layer 21 in the boundary region is higher than the impurity concentration per unit area of the P-type anode layer 6 in the diode region.

In addition, the impurity concentration profile of the P-type boundary base layer 21 in the direction along the upper surface of the drift layer 7 cyclically fluctuates. In the fourth embodiment, the fluctuation cycles of the impurity concentration profile of the P-type boundary base layer 21 and the impurity concentration profile of the P-type base layer 5 or the impurity concentration profile of the P-type anode layer 6 are different.

The P-type base layer 5 in the IGBT region in contact with the diode region in FIG. 1 or the like contributes as the P-type anode layer 6 of the diode to form a parasitic pn-diode which influences the recovery characteristics of the diode. Also, the parasitic pn-diode is influenced by the gate voltage of the IGBT.

For example, when a positive voltage is applied to the gate electrode 16 and an n-channel is formed on the sidewall of the trench, an electron current flows through the n-channel. As a result, the hole-injection efficiency of holes from the P-type base layer 5 lowers, and the carrier concentration accumulated in the N$^-$-type drift layer 7 when the diode is on lowers. Consequently, the forward voltage (VF) increases.

As a means for suppressing this phenomenon, the P$^+$-type collector layer 9 in the IGBT region is extended toward the diode region side to make the injection efficiency from the lower surface side of the N-type drift layer 7 almost zero, thereby suppressing the diode operation near the boundary with the IGBT region.

However, in this case, there remains a problem that the region in which the P$^+$-type collector layer 9 is formed on the lower surface side of the N$^-$-type drift layer 7 in the diode region cannot be effectively utilized as a diode.

Meanwhile, in the RC-IGBT according to the fourth embodiment, the boundary region is provided between the IGBT region and the diode region, and the impurity concentration of the P-type boundary base layer 21 in the boundary region is set to higher than the impurity concentration of the P-type base layer of the IGBT region. By doing so, the threshold voltage of the transistor in the boundary region is made higher than the threshold voltage of the transistor in the IGBT region to raise the n-channel resistance at the gate voltage application in the boundary region and suppress the electron current. Therefore, the reduction in the gate voltage dependence of the forward voltage of the diode is ensured.

Although the channel resistance increases, the boundary region can also serve as an IGBT; therefore, each region can be effectively used.

Effect Produced by Embodiments Described Above

Next, examples of effects produced by the embodiments described above are described. It should be noted that, in the following description, effects will be described based on the specific configurations illustrated as the examples in the embodiments described above. However, within the scope of the similar effects, such configurations may be replaced with other specific configurations illustrated as examples in the present specification. That is, hereinafter, for the sake of convenience, only one of the associated specific configurations may be described as a representative. However, this may be replaced with other specific configurations to which the representatively described specific configurations are associated.

Further, the replacement may be made across the plurality of embodiments. That is, a case in which similar effects are produced by combining respective configurations whose examples are described in the different embodiments may be adoptable.

According to the embodiments described above, the semiconductor device is an RC-IGBT in which the IGBT region and the diode region, which are an active region, and the termination region surrounding the active region in plan view are provided on a single semiconductor substrate 19. The drift layer 7 of a first conductivity type (N$^-$-type) is provided on the upper surface of the semiconductor substrate 19. The IGBT region includes the base layer 5 of a second conductivity type (P-type) (or the P-type base layer 5A, the P-type base layer 5B) in the surface layer of the N⁻-type drift layer 7. The diode region includes the anode layer 6 of a second conductivity type (P-type) (or the P-type anode layer 6A) in the surface layer of the N⁻-type drift layer 7. The termination region includes the well layer 12 of a second conductivity type (P-type) in the surface layer of the N⁻-type drift layer 7. The impurity concentration profile of the P-type base layer 5 and the impurity concentration profile of the P-type anode layer 6 in the direction along the upper surface of the N⁺-type drift layer 7 cyclically fluctuate. And the impurity concentration profile of the P-type base layer 5 and the impurity concentration profile of the P-type anode layer 6 are different.

According to such a configuration, the impurity concentration profiles of the base layer and the anode layer cyclically fluctuate, thereby reducing the inflow of holes and suppressing an increase in recovery loss.

It should be noted that when other configurations whose examples are described in the present specification are appropriately added to the above configurations, that is, when other configurations in the present specification that are not referred as the above configurations are added as appropriate, the similar effects are also produced.

Further, according to the embodiments described above, the fluctuation cycles of the impurity concentration profile of the P-type base layer 5 and the impurity concentration profile of the P-type anode layer 6 are different. According to such a configuration, by increasing the degree of freedom of concentration distribution, reducing the inflow of holes and suppressing an increase in recovery loss.

Further, according to the embodiments described above, the impurity concentration per unit area in plan view of the P-type base layer 5A is higher than the impurity concentration per unit area in plan view of the P-type anode layer 6A. According to such a configuration, the reduction in the diode recovery loss is ensured while maintaining the threshold voltage and the RBSOA of the IGBT.

Further, according to the embodiments described above, the depth at which the P-type base layer 5A is formed is deeper than the depth at which the P-type anode layer 6A is formed (that is, the thickness of the P-type anode layer 6A is thinner than that of the P-type base layer 5A). According to such a configuration, the impurity concentration profiles of the base layer and the anode layer cyclically fluctuate, thereby reducing the inflow of holes and suppressing an increase in recovery loss.

Further, according to the embodiments described above, the IGBT region includes the N⁺-type source layer 3 in the surface layer of the P-type base layer 5B, the gate oxide film 15 that is formed in contact with the P-type base layer 5B interposed between the N⁺-type source layer 3 and the N⁻-type drift layer 7, and the gate electrode 16 formed in contact with gate oxide film 15. In terms of the impurity concentration per unit area of the P-type base layer 5B, the impurity concentration per unit area is lower in positions away from the gate electrode 16 than that in the positions close to the gate electrode 16. According to such a configuration, the pinch resistance can be lowered while maintaining the desired power voltage (Vth) in the IGBT. Therefore, the RBSOA is improved.

Further, according to the embodiments described above, the semiconductor device has a boundary region located between the IGBT area and the diode region. The boundary region is equipped with the boundary base layer 21 of a second conductivity type in the surface layer of the drift layer 7. The impurity concentration of the boundary base layer 21 is higher than the impurity concentration of the P-type base layer 5 and the impurity concentration of the P-type anode layer 6. According to such a configuration, the reduction in the gate voltage dependence of the forward voltage (VF) of the diode is ensured.

Further, according to the embodiments described above, the impurity concentration profile of the P-type boundary base layer 21 in the direction along the upper surface of the drift layer 7 cyclically fluctuates. The fluctuation cycle of the impurity concentration profile of the P-type boundary base layer 21 and the impurity concentration profile of the P-type base layer 5 or the impurity concentration profile of the P-type anode layer 6 are different. According to such a configuration, by increasing the degree of freedom of concentration distribution, reducing the inflow of holes and suppressing an increase in recovery loss.

According to the embodiments described above, the drift layer 7 of the first conductivity type is formed on the upper surface of the semiconductor substrate 19 in the method of manufacturing the semiconductor device. Then, using a common mask (for example, photomask 20), the P-type base layer 5 of the second conductivity type is formed in the surface layer of the drift layer 7 in the IGBT region, the P-type anode layer 6 of the second conductivity type is formed in the surface layer of the drift layer 7 in the diode region, and well layer 12 of the second conductivity type is formed in the surface layer of the drift layer 7 in the termination region. The photomask 20 has cyclically arranged openings whose width in the region corresponding to the P-type base layer 5 differs from the width in the region corresponding to the P-type anode layer 6. The impurity concentration profile of the P-type base layer 5 and the impurity concentration profile of the P-type anode layer 6 in the direction along the upper surface of the drift layer 7 cyclically fluctuate. Further, the impurity concentration profile of the P-type base layer 5 and the impurity concentration profile of the P-type anode layer 6 are different.

According to such a configuration, the impurity concentration profiles of the base layer and the anode layer cyclically fluctuate, thereby reducing the inflow of holes and suppressing an increase in recovery loss.

Also, even if a plurality of P-type semiconductor layers are formed at different concentrations or different depths, the P-type semiconductor layers (specifically, the P-type base layer 5, the P-type anode layer 6, and the P-type well layer 12) are formed with a single round of photomechanical process (that is, with a single sheet photomask), without using a plurality of photomasks (that is, without performing a plurality of round of photomechanical processes). Therefore, the reduction in manufacturing cost of an RC-IGBT is ensured.

It should be noted that the order in which each process is performed is changeable unless otherwise specified.

Further, when other configurations whose examples are described in the present specification are appropriately added to the above configurations, that is, when other configurations in the present specification that are not referred as the above configurations are added as appropriate, the similar effects are also produced.

Modification Example of Embodiments Described Above

Although in the embodiments described above, the qualities of materials of, materials of, dimensions of, shapes of, relative arrangement relationships, or conditions of implementation of each component may also be described, they are illustrative in all aspects and are not limited to those described herein.

Accordingly, it is understood that numerous other modifications, variations, and equivalents can be devised without departing from the scope of the technology disclosed in the present specification. For example, a case where modifying at least one component, a case where adding or omitting components, and further, a case where extracting at least one component in at least one embodiment and combining it with a component of another embodiment are included.

Further, in the above-described embodiments, when a material name or the like is described without being specified, the material contains other additives, for example, an alloy or the like, so far as consistent with the embodiments.

Further, "one or more" components may be included when it is described that "one" component is included in the embodiments described above, so far as consistent with the embodiments.

Furthermore, each component in the embodiments described above is a conceptual unit, and within the scope of the technology disclosed in the present specification, a case where one component is composed of a plurality of structures, a case where one component corresponds to a part of a structure, and further, a case where a plurality of components are provided in one structure are included.

Further, each component in the embodiments described above includes a structure having another structure or shape as long as the same function is exhibited.

Also, the descriptions in the present specification are referred for the every object related to the technique, and none of them are regarded as conventional techniques.

While the disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device, which is a reverse conducting insulated gate bipolar transistor (RC-IGBT) in which an IGBT region and a diode region, which are an active region, and a termination region surrounding the active region in plan view are provided on a single semiconductor substrate, wherein a drift layer of a first conductivity type is provided on an upper surface of the semiconductor substrate, the IGBT region includes a base layer of a second conductivity type in a surface layer of the drift layer, the diode region includes an anode layer of the second conductivity type in the surface layer of the drift layer, the termination region includes a well layer of the second conductivity type in the surface layer of the drift layer, an impurity concentration profile of impurities of the second conductivity type in the base layer and an impurity concentration profile of impurities of the second conductivity type in the anode layer in a direction along an upper surface of the drift layer cyclically fluctuate at a same depth, and the impurity concentration profile of the base layer and the impurity concentration profile of the anode layer are different.

2. The semiconductor device according to claim 1, wherein fluctuation cycles of the impurity concentration profile of the base layer and the impurity concentration profile of the anode layer are different.

3. The semiconductor device according to claim 1, wherein an impurity concentration per unit area in plan view of the base layer is higher than an impurity concentration per unit area in plan view of the anode layer.

4. The semiconductor device according to claim 1, wherein a depth at which the base layer is formed is deeper than a depth at which the anode layer is formed.

5. The semiconductor device according to claim 1, wherein the IGBT region further includes a source layer of the first conductivity type in a surface layer of the base layer, a gate insulating film formed in contact with the base layer interposed between the source layer and drift layer, and a gate electrode formed in contact with the gate insulating film, and in terms of the impurity concentration per unit area of the base layer, the impurity concentration per unit area is lower in positions away from the gate electrode than that in the positions close to the gate electrode.

6. The semiconductor device according to claim 1, further comprising a boundary region located between the IGBT region and the diode region, wherein the boundary region is equipped with a boundary base layer of the second conductivity type in the surface layer of the drift layer, and an impurity concentration of the boundary base layer is higher than the impurity concentration of the base layer and the impurity concentration of the anode layer.

7. The semiconductor device according to claim 6, wherein the impurity concentration profile of the boundary base layer in the direction along the upper surface of the drift layer cyclically fluctuates, and fluctuation cycles of the impurity concentration profile of the boundary base layer and the impurity concentration profile of the base layer or the impurity concentration profile of the anode layer are different.

8. The semiconductor device according to claim 1, wherein a depth from the upper surface of the substrate at which the base layer is formed is deeper than a maximum depth from the upper surface of the substrate at which the anode layer is formed.

9. The semiconductor device according to claim 1, wherein a first distance between adjacent peaks of impurity concentration in a fluctuation cycle of the impurity concentration profile of the base layer is different from a second distance between adjacent peaks of impurity concentration in a fluctuation cycle of the impurity concentration profile of the anode layer.

10. The semiconductor device according to claim 1, wherein a cycle of change of impurity concentration in the anode layer is shorter along the first direction than a cycle of change of impurity concentration in the base layer.

* * * * *